(12) United States Patent
Kurihara (10) Patent No.: US 11,145,685 B2
(45) Date of Patent: Oct. 12, 2021

(54) IMAGE CAPTURING DEVICE AND CAMERA

(71) Applicant: CANON KABUSHIKI KAISHA, Tokyo (JP)

(72) Inventor: Masaki Kurihara, Koza-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/537,756

(22) Filed: Aug. 12, 2019

(65) Prior Publication Data
US 2020/0066769 A1 Feb. 27, 2020

(30) Foreign Application Priority Data
Aug. 22, 2018 (JP) .............................. JP2018-155688

(51) Int. Cl.
*H01L 27/146* (2006.01)
(52) U.S. Cl.
CPC .... *H01L 27/1463* (2013.01); *H01L 27/14612* (2013.01); *H01L 27/14643* (2013.01); *H01L 27/14683* (2013.01); *H01L 27/14621* (2013.01); *H01L 27/14623* (2013.01); *H01L 27/14627* (2013.01)
(58) Field of Classification Search
CPC .......... H01L 27/1463; H01L 27/14612; H01L 27/14643
USPC ....................................................... 257/231
See application file for complete search history.

(56) References Cited

U.S. PATENT DOCUMENTS

| 8,786,739 | B2 | 7/2014 | Kurihara |
| 9,305,965 | B2 | 4/2016 | Kurihara et al. |
| 10,074,684 | B2 | 9/2018 | Okazaki et al. |
| 10,497,732 | B2 | 12/2019 | Kurihara et al. |
| 10,497,733 | B2 | 12/2019 | Kurihara et al. |
| 2007/0194356 | A1* | 8/2007 | Moon ................. H01L 27/1463 257/291 |
| 2009/0256226 | A1 | 10/2009 | Tatani et al. |
| 2010/0144084 | A1* | 6/2010 | Doan ................. H01L 31/02327 438/72 |
| 2010/0225775 | A1 | 9/2010 | Koga et al. |

(Continued)

FOREIGN PATENT DOCUMENTS

| JP | 2012-253224 A | 12/2012 |
| JP | 2013-243324 A | 12/2013 |

OTHER PUBLICATIONS

English Machine Translation of Japan Patent Application JP2012253224 (Year: 2012).*

*Primary Examiner* — Dzung Tran
(74) *Attorney, Agent, or Firm* — Venable LLP (57) ABSTRACT

An image capturing device is provided. The device includes a substrate comprising a pixel region, a peripheral region and a trench region, in which trenches are formed, between the pixel region and the peripheral region. The plurality of trenches include first trenches arranged to be spaced apart from each other in a first direction along a first side of an outer edge of the pixel region and second trenches arranged to be spaced apart from each other in the first direction. The first and second trenches are arranged to be spaced apart from each other in a second direction crossing the first direction. The first and second trenches are arranged so that, any straight line path which connects, without overlapping any one of the first and second trenches, the first side and the peripheral region, does not exist.

22 Claims, 9 Drawing Sheets

(56) References Cited

U.S. PATENT DOCUMENTS

| | | |
|---|---|---|
| 2011/0155893 A1 | 6/2011 | Endo et al. |
| 2014/0239362 A1* | 8/2014 | Koo .................... H01L 27/1464 257/294 |
| 2016/0056200 A1* | 2/2016 | Lee ........................ H04N 5/359 250/208.1 |
| 2017/0365631 A1 | 12/2017 | Iizuka et al. |
| 2017/0373108 A1* | 12/2017 | Hwangbo ......... H01L 27/14621 |

* cited by examiner

IMAGE CAPTURING DEVICE AND CAMERA

BACKGROUND OF THE INVENTION

Field of the Invention

The present invention relates to an image capturing device and a camera.

Description of the Related Art

Japanese Patent Laid-Open No. 2013-243324 discloses an image capturing device in which a trench structure is formed between pixels.

SUMMARY OF THE INVENTION

In an image capturing device, when an impurity is diffused from the peripheral region of a pixel region to the pixel region, the impurity diffusion causes generation of noise, and the image quality of a resultant image may degrade. Therefore, in order to obtain a high-quality image, the diffusion of the impurity from the peripheral region to the pixel region must be suppressed.

Some embodiments of the present invention provide a technique advantageous in improving the image quality of the image capturing device.

According to some embodiments, an image capturing device including a substrate comprising a pixel region in which a plurality of pixels are arranged and a peripheral region positioned around the pixel region, wherein the image capturing device further comprises a trench region, in which a plurality of trenches are formed in the substrate, between the pixel region and the peripheral region, the plurality of trenches include a plurality of first trenches arranged to be spaced apart from each other in a first direction along a first side and a plurality of second trenches arranged to be spaced apart from each other in the first direction between the first side of an outer edge of the pixel region and a part of the peripheral region, the part of the peripheral region opposing the first side, the plurality of first trenches and the plurality of second trenches are arranged to be spaced apart from each other in a second direction crossing the first direction, and the plurality of first trenches and the plurality of second trenches are arranged so that, in orthographic projection for an upper surface of the substrate, any straight line path which connects, without overlapping any one of the plurality of first trenches and the plurality of second trenches, the first side and the part of the peripheral region, does not exist, is provided.

Further features of the present invention will become apparent from the following description of exemplary embodiments (with reference to the attached drawings).

DESCRIPTION OF THE EMBODIMENTS

Detailed embodiments of an image capturing device according to the present invention will now be described with reference to the accompanying drawings. Note that in the following description and drawings, common reference numerals denote common components throughout a plurality of drawings. Hence, the common components will be described by cross-referencing to the plurality of drawings, and a description of components denoted by common reference numerals will appropriately be omitted.

Figure 1:
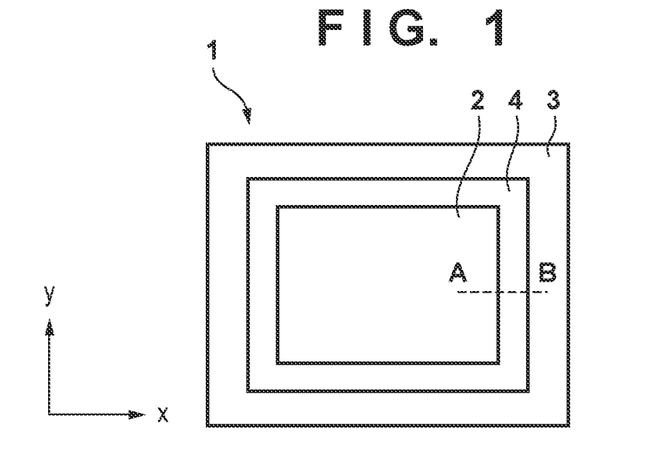
FIG. 1 is a plan view of an image capturing device according to an embodiment of the present invention.

The structure and manufacturing method of an image capturing device according to an embodiment of the present invention will be described with reference to FIGS. 1 to 5E. FIG. 1 is a plan view showing the structure of an image capturing device 1 according to the first embodiment of the present invention. FIG. 1 shows the one-chip image capturing device 1. The image capturing device 1 includes a substrate including a pixel region 2 in which a plurality of pixels are arranged, and a peripheral region 3 positioned around the pixel region 2. A circuit for reading out a signal from the pixel region 2 and the like can be arranged in the peripheral region 3. In this embodiment, the image capturing device 1 further includes a trench region 4 including a plurality of trenches arranged in a substrate between the pixel region 2 and the peripheral region 3.

Figure 2:
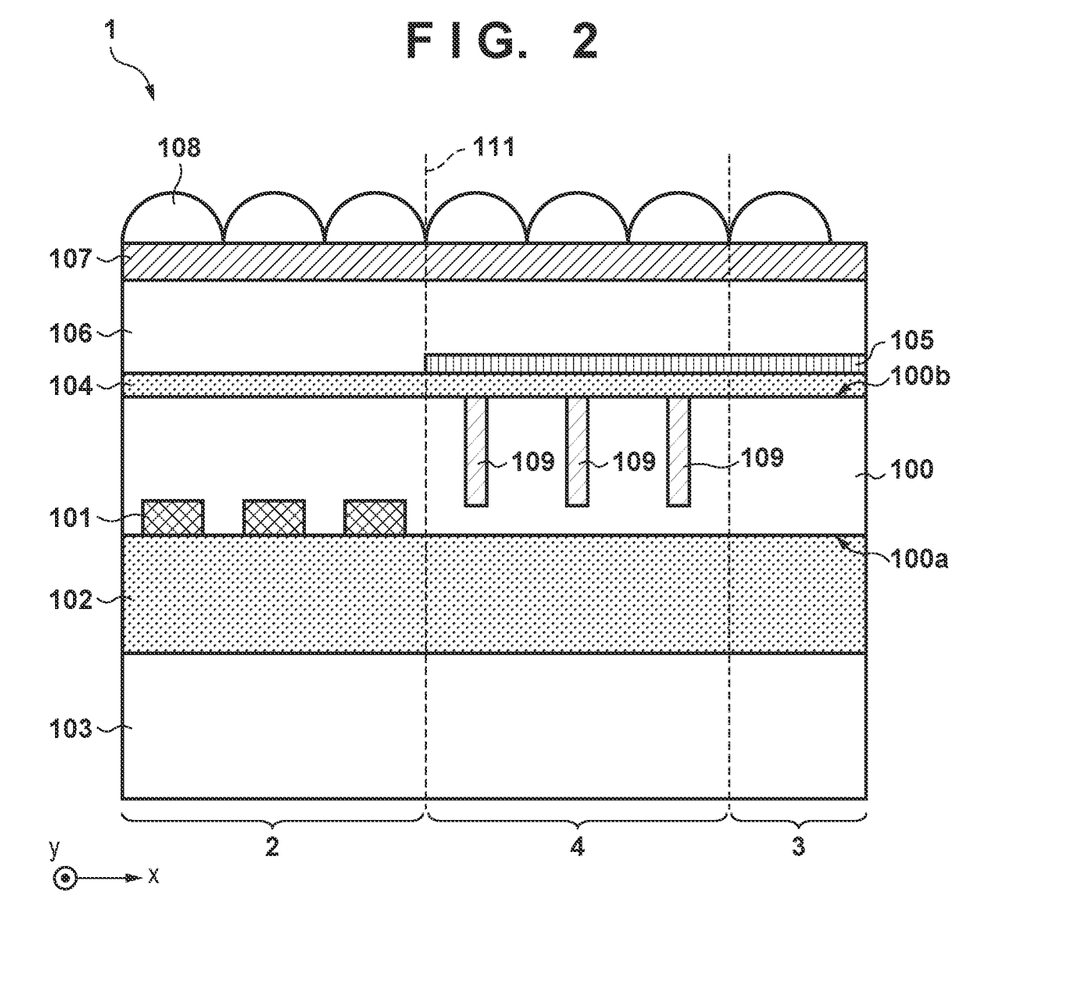
FIG. 2 is a sectional view of the image capturing device shown in FIG. 1.

FIG. 2 is a sectional view taken along a line A-B in FIG. 1 and shows the sectional structure of the pixel region 2, the peripheral region 3, and the trench region 4 formed between the pixel region 2 and the peripheral region 3. A semiconductor substrate made of, for example, silicon is used as a substrate 100. One photoelectric conversion element 101 is arranged for each pixel in the pixel region 2 on an upper surface 100a of the substrate 100. In addition, for example, a transistor for transferring charges accumulated in each photoelectric conversion element 101 is arranged on the upper surface 100a of the substrate 100. The photoelectric conversion element 101 and the transistor can be element-isolated using an STI (Shallow Trench Isolation) structure, or the like. The upper surface 100a of the substrate 100 is covered with a structure 102. A wiring pattern, an interlayer dielectric film, a passivation film (PV film), and the like are arranged in the structure 102. The substrate 100 is supported on a support substrate 103 via the structure 102.

A plurality of trenches 109 for suppressing impurity diffusion from the peripheral region 3 to the pixel region 2 are formed in a lower surface 100b of the substrate 100 on the side opposite to the upper surface 100a. The interior of each trench 109 can be hollow or embedded with at least one of an insulator, a metal, a metal oxide, or a metal nitride. Tungsten or the like having a small diffusion coefficient for diffusing in the substrate 100, which uses silicon or the like, is used as the metal material used for the metal, the metal oxide, or the metal nitride embedded in each trench 109. Titanium, tantalum, aluminum, or the like may be used as the metal material. In this embodiment, the metal oxide and the silicon nitride are arranged in each trench 109. As shown in FIG. 2, the plurality of trenches 109 can have their bottoms in the substrate 100. In other words, each trench 109 need not extend through the substrate 100. Even if each trench 109 does not extend through the substrate 100, the impurity passing through the interior of the substrate 100 from the peripheral region 3 to the pixel region 2 can be prevented from diffusing. As shown in FIG. 2, the depth of each of the plurality of trenches 109 can be half or more the thickness of the substrate 100. For example, the depth of each trench 109 can be larger than that of a trench of the STI structure arranged in the upper surface 100a of the substrate 100.

The lower surface 100b of the substrate 100 is covered with a metal oxide/silicon nitride layer 104 arranged in each trench 109. A light shielding layer 105 is arranged on the peripheral region 3 and the trench region 4 out of the metal oxide/silicon nitride layer 104. An insulating layer 106 is arranged on the metal oxide/silicon nitride layer 104 and the light shielding layer 105 of the pixel region 2. For example, silicon oxide is used as the insulating layer 106. The insulating layer 106 can have a single-layer structure or a stacked structure including a plurality of types of insulating films. A light shielding wall formed in a direction perpendicular to the lower surface 100b of the substrate 100 may be formed for each pixel in the insulating layer 106. In addition, a light guide such as an inner lens may be formed for each pixel in the insulating layer 106. A color filter 107 is formed on the insulating layer 106, and microlenses 108 are formed on the color filter 107. As shown in FIG. 2, the image capturing device 1 of this embodiment is a so-called back irradiation type image capturing device.

Figure 3:
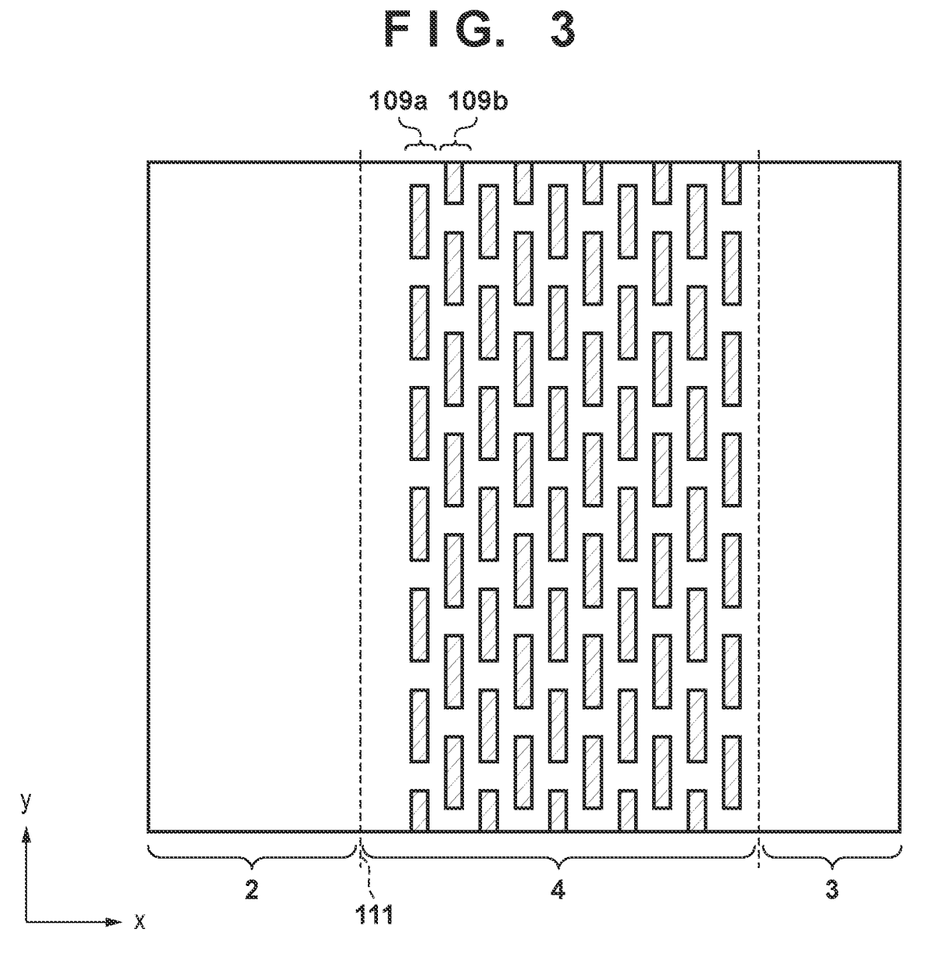
FIG. 3 is a plan view of the trench region of the image capturing device shown in FIG. 2.

FIG. 3 is a view for explaining the details of the trench layout in the trench region 4. FIG. 3 is an enlarged view near a side 111 along the y direction (the first direction) out of the outer edge of the rectangular pixel region 2 of the image capturing device 1 in FIG. 1. The plurality of trenches 109 include, between the side 111 and the peripheral region 3 opposing the side 111, a plurality of trenches 109a (the first trenches) arranged to be spaced apart from each other in the y direction along the side 111, and a plurality of trenches 109b (the second trenches) arranged to be spaced apart from each other in the y direction. In this embodiment, each trench 109 has a rectangular shape having a long side having a length of 1 µm along the y direction and a short side having a length of 0.25 µm along the x direction (the second direction) crossing (perpendicular to) the y direction. The trenches 109 are arranged at the same pitch in the x direction. The trenches 109 have a depth of 2.5 µm. Two adjacent trenches are spaced apart from each other by 0.3 µm in the y direction. The plurality of trenches 109a and the plurality of trenches 109b are spaced apart from each other by 0.25 µm in the x direction crossing the y direction. The plurality of trenches 109a and the plurality of trenches 109b are arranged to shift by a half pitch in the y direction, as shown in FIG. 3. In the arrangement shown in FIG. 3, a total of 10 arrays each made of a combination of the plurality of trenches 109a and the plurality of trenches 109b are arranged in the x direction. However, the present invention is not limited to this. Nine arrays or less or 11 arrays or more may be used. At least the combination of the plurality of trenches 109a and the plurality of trenches 109b is arranged for each array.

Figure 4:
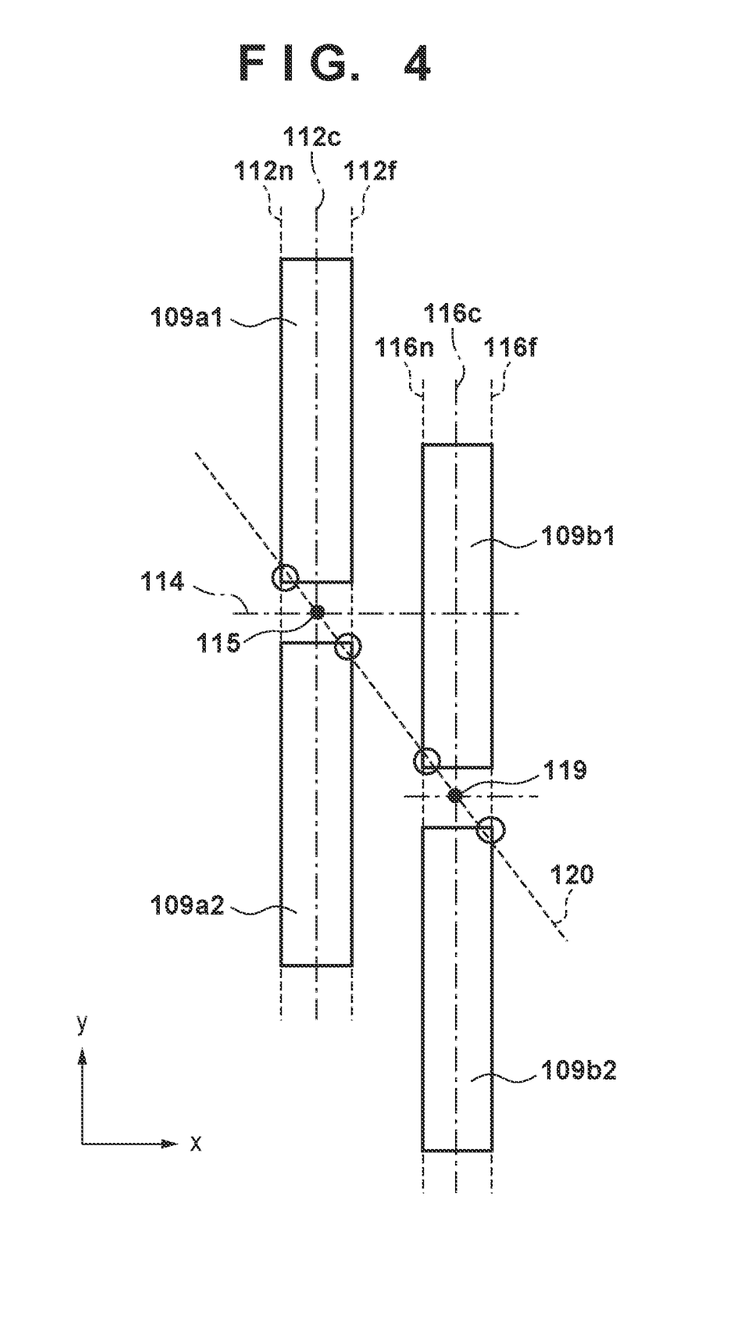
FIG. 4 is a view showing the layout of trenches in a trench region shown in FIG. 3.

FIG. 4 shows the layout of the trenches 109a and the trenches 109b in more detail. In this case, the relationship between the trenches 109a and the trenches 109b in the orthographic projection for the upper surface 100a of the substrate 100 will be described with reference to FIG. 4. The plurality of trenches 109a include a rectangular trench 109a1 (the (1-1)th trench) and a rectangular trench 109a2 (the (1-2)th trench) which are adjacent to each other in the y direction. The plurality of trenches 109b include a rectangular trench 109b1 (the (2-1)th trench) and a rectangular trench 109b2 (the (2-2)th trench) which are adjacent to each other in the y direction.

As shown in FIG. 4, a line for connecting the most nearest points to the side 111 of the trench 109a1 and the trench 109a2 is defined as a line 112n. In addition, a line for connecting the farthest points from the side 111 of the trench 109a1 and the trench 109a2 is defined as a line 112f. If a line passing through the center between the lines 112n and 112f is defined as a line 112c, a point of the line 112c which bisects the distance between the trench 109a1 and the trench 109a2 is defined as a midpoint 115 (the first point).

At this time, as shown in FIG. 4, the trench 109b1 is arranged at a position overlapping a line 114 extending from the midpoint 115 in the x direction. In addition, similar to the relationship between the trenches 109a1 and 109a2, in the orthographic projection for the upper surface 100a of the substrate 100, a line for connecting the nearest points to the side 111 between the trench 109b1 and the trench 109b2 is defined as a line 116n. In addition, a line for connecting the farthest points from the side 111 of the trench 109b1 and the trench 109b2 is defined as a line 116f. If a line passing through the center between the lines 116n and 116f is defined as a line 116c, a point of the line 116c which bisects the distance between the trench 109b1 and the trench 109b2 is defined as a midpoint 119 (the second point).

At this time, the trenches 109a and 109b are arranged such that a straight line 120 passing through the midpoint 115 and the midpoint 119 overlaps at least one of the trenches 109a1, 109a2, 109b1, and 109b2. That is, the trenches 109a and 109b are arranged such that a straight line path which connects, without overlapping with any one of the trenches included in the plurality of trenches 109a and the plurality of trenches 109b, the side 111 and the peripheral region 3 opposing the side 111, does not exist. In this embodiment, if the trenches 109a and the trenches 109b are arranged at the size and interval as described above, the straight line 120 overlaps all the trenches 109a1, 109a2, 109b1, and 109b2 on the path of the straight line 120, as shown in FIG. 4.

For example, when forming a circuit of the peripheral region 3, an impurity may be taken into the interior of the substrate 100 in the peripheral region 3. As will be described later, when the lower surface 100b of the substrate 100 is polished using a chemical mechanical polishing (CMP) method or the substrate is diced to obtain the image capturing device 1 as a chip, impurities can be attached to the lower surface 100b or the like of the substrate 100 of the image capturing device 1. These impurities can diffuse from the peripheral region 3 to the pixel region 2 and be a cause of noise. If metal materials such as cobalt and nickel having a larger diffusion coefficient than that of oxygen in the substrate 100 using silicon are used in the peripheral region 3, the diffusion of these metal materials to the pixel region 2 may cause a white defect. These metal materials can be derived from silicide layers (for example, a cobalt silicide layer and a nickel silicide layer) arranged in transistors arranged in the peripheral region 3. When one of the plurality of trenches 109 is always arranged on the straight line path for connecting the side 111 and the peripheral region 3 opposing the side 111, impurity diffusion from the peripheral region 3 to the pixel region 2 can be suppressed, and generation of a white defect or the like can be suppressed. As a result, the quality of the image obtained using the image capturing device 1 can be improved.

In addition, in the x direction, a pixel of the plurality of pixels which is arranged nearest to the trench region 4 may be spaced apart by a distance corresponding to two pixels from a trench of the plurality of trenches 109 which is located nearest to the pixel region 2. When a trench 109 deeper than the STI structure used for the element isolation is formed in the substrate 100, local stress may occur in the substrate 100. By keeping a predetermined distance between the pixel region 2 and each trench 109, the local stress can be relaxed, and noise can be suppressed. On the other hand, the trenches 109 aligned in the plurality of arrays in the x direction are deformed, for example, to relax the stress generated between the pixel region 2 and the peripheral region 3 having different circuit arrangements. As a result, generation of noise generated by the stress caused by the peripheral region 3 in the pixel region 2 can be suppressed. In addition, the degree of freedom of design about the stresses in the pixel region 2 and the peripheral region 3 can be increased, and the stress designs appropriate for the respective regions can be performed.

In this case, the size (distance) of one pixel can be obtained from the pitch between the photoelectric conversion elements 101 of the adjacent pixels. For example, in the orthographic projection for the upper surface 100a of the substrate 100, a distance between the geometric barycenters of the photoelectric conversion elements 101 of the adjacent pixels can be the size of one pixel. X- and y-direction lines passing through the midpoint of a line connecting the geometric barycenters of the photoelectric conversion elements 101 of the adjacent pixels can be outer edges of the respective pixels. The outer edge of the pixel region 2 can be the outer edge of each pixel arranged at the outermost position. Each pixel arranged on the outer edge of the pixel region 2 can be a pixel which receives light or a light shielding pixel (an optical black pixel) covered with the light shielding layer 105. In addition, the size of the pixel may be obtained from each microlens 108 formed on each pixel arranged on the substrate 100. The size of each microlens 108 can correspond to the size of each pixel.

In this embodiment, the trenches 109 have the same size and the same shape. However, the present invention is not limited to this. For example, the trenches 109a and the trenches 109b may have different shapes and sizes. In addition, for example, among the trenches 109a and the trenches 109b, trenches having different shapes and different sizes may be included. It suffices that no straight line path connecting the side 111 and the peripheral region 3 opposing the side 111 exists without overlapping any trench 109.

The layout of the trenches 109 has been described by paying attention to only the side 111 of the pixel region 2. However, the trench region 4 may be formed along only one side of the outer edge of the pixel region 2 or may be formed along two or more sides. The trench region 4 may surround the entire outer edge of the pixel region 2. For example, the plurality of trenches 109 may include at least two arrays of trenches spaced apart from each other in the x direction and arranged between a given side opposite to the side 111 of the entire outer edge of the pixel region 2 along the y direction and the peripheral region 3 opposite to the given side. Alternatively, for example, the plurality of trenches 109 can include at least two arrays of trenches spaced apart from each other in the y direction and arranged between a given side along the x direction and the peripheral region 3 opposing the given side of the entire outer edge of the pixel region 2. Alternatively, the plurality of trenches 109 may include at least two arrays of trenches spaced apart from each other in the y direction and arranged between the two sides of the entire outer edge of the pixel region 2 along the x direction and the peripheral region 3 opposing these two sides. In any case, it suffices that no straight line path connecting the side of the outer edge of the pixel region 2 and the peripheral region 3 opposing this side exists without overlapping with any of the trenches 109.

Figure 5A:
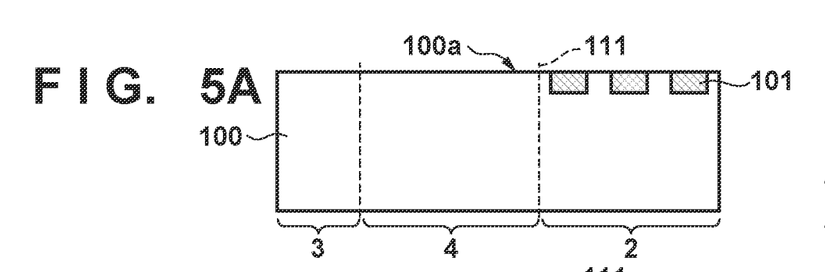
FIGS. 5A to 5E are views showing a method of manufacturing the image capturing device shown in FIG. 2.
Figure 5B:
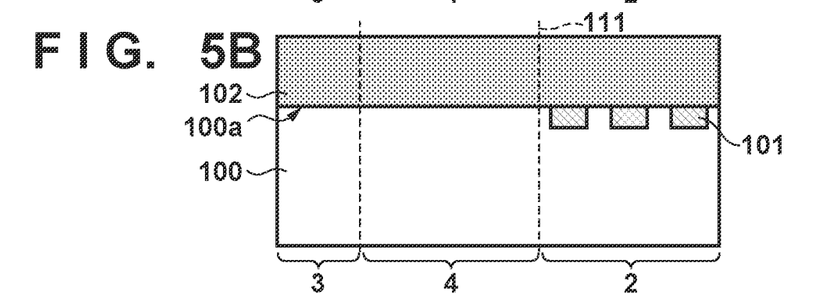

A method of manufacturing the image capturing device 1 according to this embodiment will be described with reference to FIGS. 5A to 5E. First, as shown in FIG. 5A, the photoelectric conversion elements 101, transistors for transferring the charges accumulated in the photoelectric conversion elements 101, and the like are formed in a region serving as the pixel region 2 of the upper surface 100a of the substrate 100. Each transistor for transferring the charges accumulated in each photoelectric conversion element 101 can be arranged between the photoelectric conversion element 101 and a readout signal line shared by a plurality of pixels arranged in one column or row. In addition, a circuit for reading out a signal from the pixel region may be formed in the region serving as the peripheral region 3 of the upper surface 100a of the substrate 100 simultaneously with formation of the photoelectric conversion element 101 and the like. After formation of the photoelectric conversion elements 101, the structure 102 including a wiring pattern, an interlayer dielectric film, the PV film, and the like is formed, as shown in FIG. 5B. The photoelectric conversion elements 101, the structure 102, and the like can be formed using a known semiconductor process. For example, the photoelectric conversion elements 101 and the structure 102 may be formed using a process similar to that of a front irradiation type image capturing device.

Figure 5C:
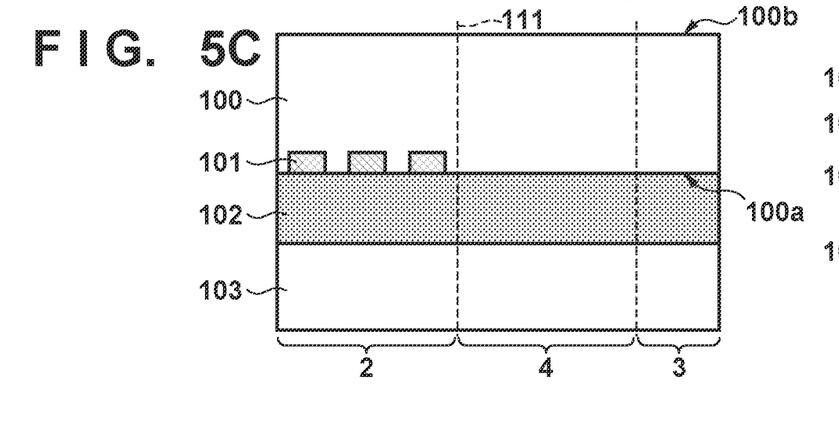

After formation of the structure 102, the support substrate 103 is bonded to the upper surface of the structure 102, as shown in FIG. 5C. In this embodiment, bonding of the upper surfaces of the structure 102 and the support substrate 103 is performed using a so-called room temperature bonding method for activating the respective surfaces and bonding them by irradiating the surfaces with a plasma. However, the present invention is not limited to this. The structure 102 and the support substrate 103 may be bonded via, for example, a bonding member having, for example, an adhesive property. In addition, in this embodiment, a substrate obtained by forming silicon oxide on a silicon substrate is used as the support substrate 103, but the present invention is not limited to this. For example, a substrate on which functions such as an ASIC (Application Specific Integrated Circuit) function, a memory function, and the like are provided may be used as the support substrate 103.

Figure 5D:
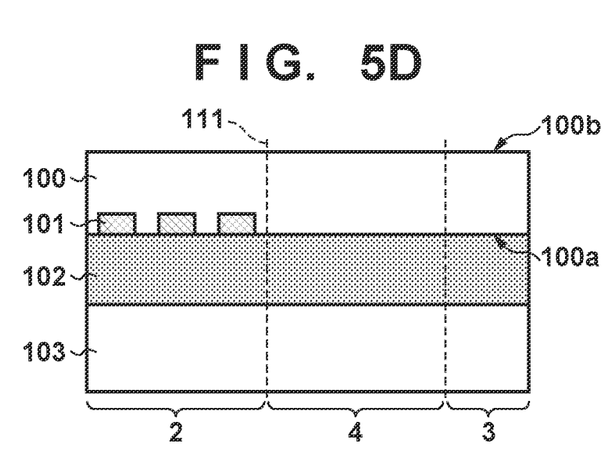

After the substrate 100 is bonded to the support substrate 103, the lower surface 100b on the side opposite to the upper surface 100a of the substrate 100 on which the photoelectric conversion elements 101 are formed is polished to thin the substrate 100, as shown in FIG. 5D. After thinning the substrate 100, its thickness can be, for example, about 1 to 10 µm. In this embodiment, the substrate 100 was made thin to a thickness of about 3 µm. The substrate 100 may be thinned using a grinder apparatus, a wet etching apparatus, a CMP apparatus, or the like. In this embodiment, the silicon substrate 100 was thinned using a grinder apparatus and a CMP apparatus.

Figure 5E:
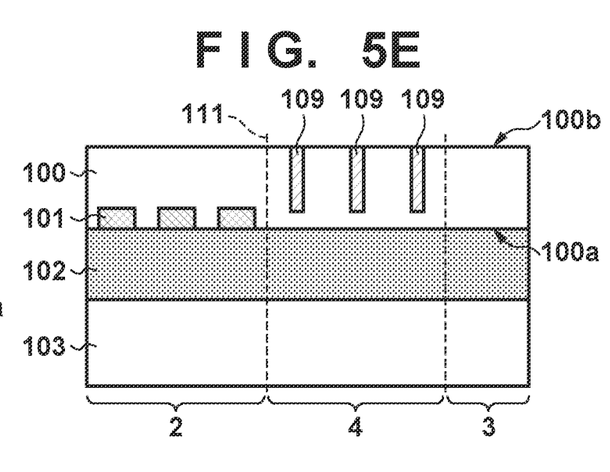

After the substrate 100 was thinned, as shown in FIG. 5E, trenches 109 having the shape described above were formed in the lower surface 100b of the substrate 100. The trench of the trenches 109 which was arranged nearest to the pixel region 2 was formed at a position spaced apart from the side 111 of the outer edge of the pixel region 2 by two pixels. The trenches 109 were formed as follows. First, a photoresist was patterned to obtain a mask pattern. Next, the substrate 100 was etched via openings of the mask pattern using the dry etching apparatus corresponding to the Bosch process. In this embodiment, $SF_6$ gas was used as a gas for etching the silicon substrate 100.

In this embodiment, after the trenches 109 were formed, a metal oxide layer was formed using an ALD (Atomic Layer Deposition) apparatus, and a silicon nitride layer was formed using a CVD apparatus to bury the trenches 109. After that, a material for forming the light shielding layer 105 was formed to cover the lower surface 100b of the substrate 100, and the material of the light shielding layer 105 was etched so as to expose the pixel region 2 to form the light shielding layer 105. Next, in this embodiment, silicon oxide was formed as the insulating layer 106. As described above, the light shielding wall and the inner lens may be formed in the insulating layer 106. The color filter 107 and the microlenses 108 were formed on the insulating layer 106 to form the image capturing device 1 shown in FIG. 2.

As described above, when the trench region 4 is formed between the pixel region 2 and the peripheral region 3, impurity diffusion from the peripheral region 3 to the pixel region 2 can be suppressed. The stress caused by the peripheral region 3 can be prevented from influencing the pixels formed in the pixel region 2. Accordingly, the quality of the image obtained by the image capturing device 1 can be improved.

Figure 6:
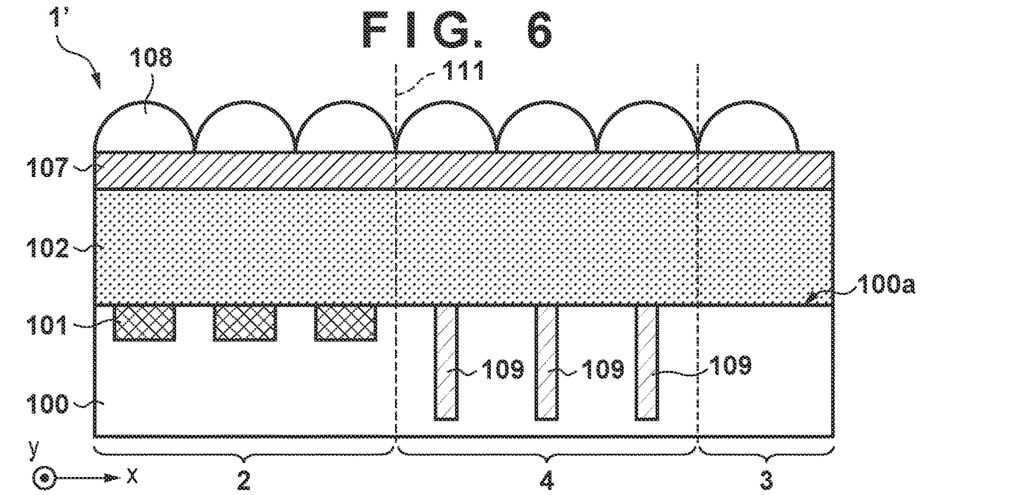
FIG. 6 is a sectional view of the image capturing device shown in FIG. 1.
Figure 7A:
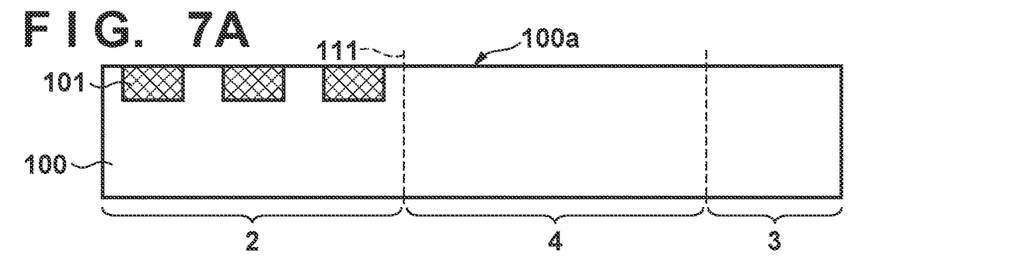
FIGS. 7A to 7C are views showing a method of manufacturing the image capturing device shown in FIG. 6.

The structure of an image capturing device 1' according to an embodiment of the present invention will be described with reference to FIGS. 6 to 7C. FIG. 6 is a sectional view of the image capturing device 1' according to the second embodiment of the present invention. FIG. 6 shows the sectional structure of a pixel region 2, a peripheral region 3, and a trench region 4 formed between the pixel region 2 and the peripheral region 3. In this embodiment, the image capturing device 1' is a front irradiation type image capturing device. Trenches 109 are formed in an upper surface 100a on which photoelectric conversion elements 101 of a substrate 100 and, for example, transistors for transferring the charges accumulated in the photoelectric conversion elements 101 are arranged. A structure 102 is arranged so as to cover the upper surface 100a of the substrate 100, and a color filter 107 and microlenses 108 are arranged on the structure 102. The structure and layout of the trenches 109 and the arrangement of the structure 102 and the like can be the same as in the first embodiment. Differences will be mainly described, and the description of the similar arrangements will be omitted.

Next, a method of manufacturing the image capturing device 1' according to this embodiment will be described with reference to FIGS. 7A to 7C. First, as shown in FIG. 7A, the photoelectric conversion elements 101, the transistors for transferring the charges accumulated in the photoelectric conversion elements 101, and the like are formed in a region serving as the pixel region 2 of the upper surface 100a of the substrate 100. A circuit for reading out a signal from the pixel region and the like may be formed simultaneously in a region serving as the peripheral region 3 of the upper surface 100a of the substrate 100.

Figure 7B:
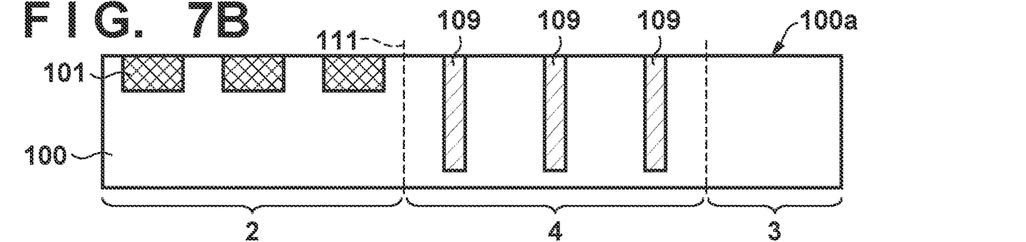

As shown in FIG. 7B, after formation of the photoelectric conversion elements 101, the trenches 109 having the same shape and layout as in the first embodiment described above were formed in the upper surface 100a of the substrate 100. The trenches 109 were formed as follows. First, a photoresist was patterned to obtain a mask pattern. Next, the substrate 100 was etched via openings of the mask pattern using the dry etching apparatus corresponding to the Bosch process. In this embodiment, $SF_6$ gas was used as a gas for etching the silicon substrate 100. The depth of each trench 109 can be larger than that of the trenches of the STI structure formed for element isolation in the pixel region 2 and the peripheral region 3.

Figure 7C:
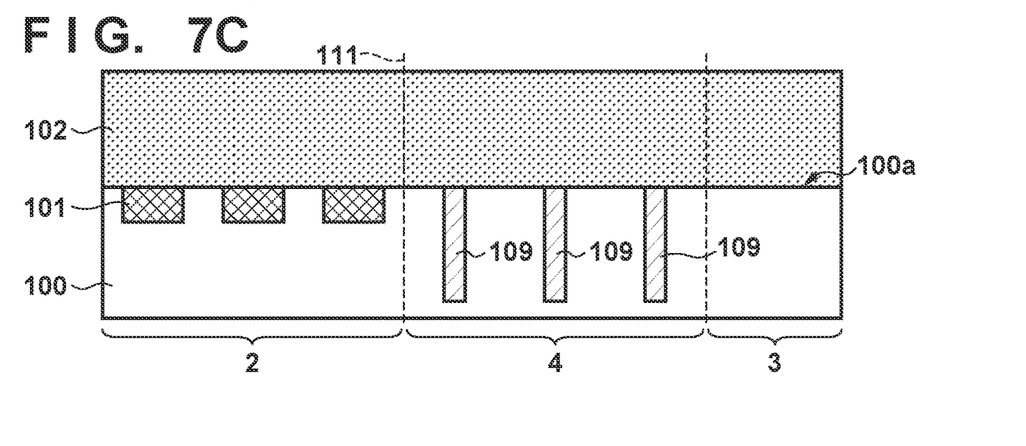

Next, as shown in FIG. 7C, the structure 102 including a wiring pattern, an interlayer dielectric film, a PV film, and the like is formed. The structure 102 may include a metal oxide layer and a silicon nitride layer to be embedded in the trenches 109. Next, by forming the color filter 107 and the microlenses 108, the image capturing device 1' shown in FIG. 6 is formed.

As described above, when the trench region 4 is formed between the pixel region 2 and the peripheral region 3, the same effect as in the back irradiation type image capturing device 1 described above can be obtained even in the front irradiation type image capturing device 1'. In addition, as compared with the above image capturing device 1, diffusion of the impurities present near the peripheral region 3 on the upper surface 100a of the substrate 100 to the pixel region 2 can be more reliably suppressed.

Figure 8:
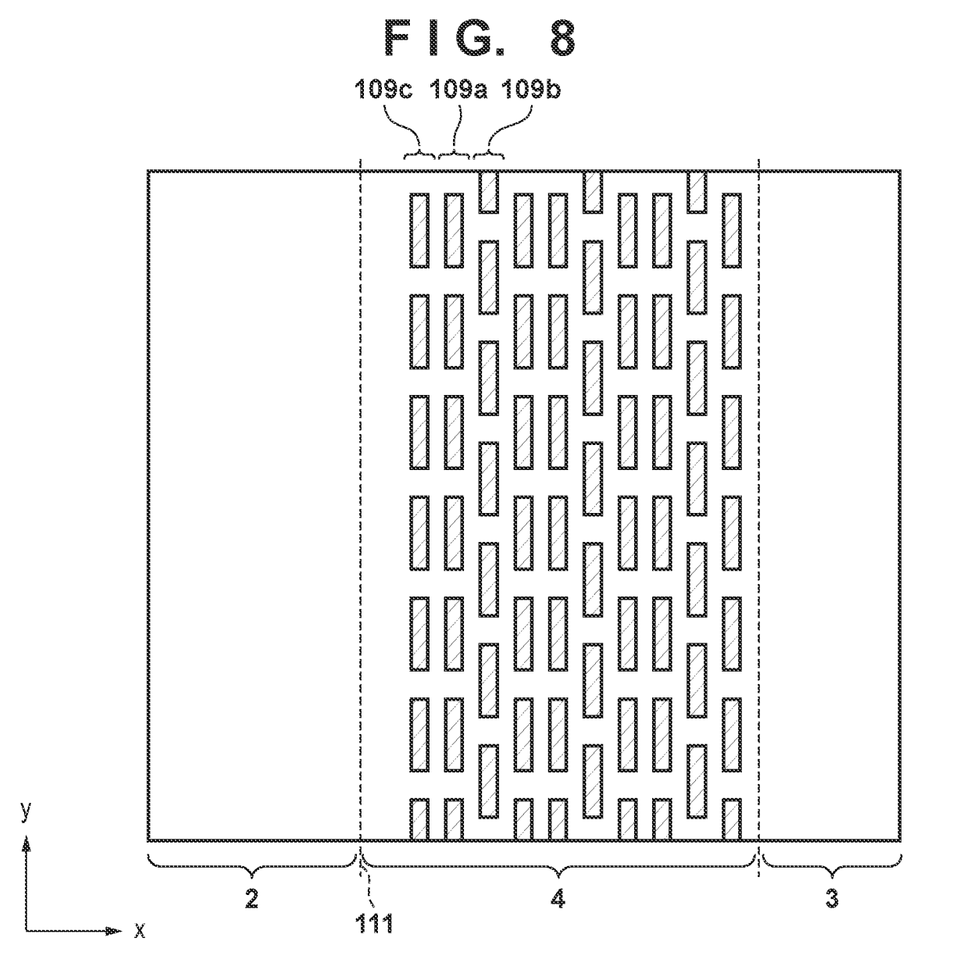
FIG. 8 is a plan view showing a modification of the trench region shown in FIG. 3.

A modification of the layout of the trenches 109 of the trench region 4 in the orthographic projection for the upper surface 100a of the substrate 100 will be described with reference to FIGS. 8 to 10. The arrangement can be similar to the image capturing device 1 and the image capturing device 1' except the layout of the trenches 109. Differences will be mainly described, and the description of similar arrangements will be omitted.

In the examples of the first and second embodiments described above, the plurality of trenches 109a and the plurality of trenches 109b are repeatedly arranged in order in the x direction. However, the arrangement of the trenches 109 is not limited to this. As shown in FIG. 8, the plurality of trenches 109 may further include a plurality of trenches 109c (the third trenches) arranged to be spaced apart from each other in the y direction. In the x direction, the plurality of trenches 109c are arranged to be spaced apart from the trenches 109a on a side opposite to the plurality of trenches 109b with respect to the plurality of trenches 109a. At this time, in the orthogonal projection for the section along the y direction of the substrate 100, the plurality of trenches 109c are arranged to overlap the plurality of trenches 109a, respectively. As shown in FIG. 8, the trenches 109c obtained by translating the trenches 109a in a direction opposite to the trenches 109b, the trenches 109a, and the trenches 109b may be arranged repeatedly in order in the x direction.

Figure 9:
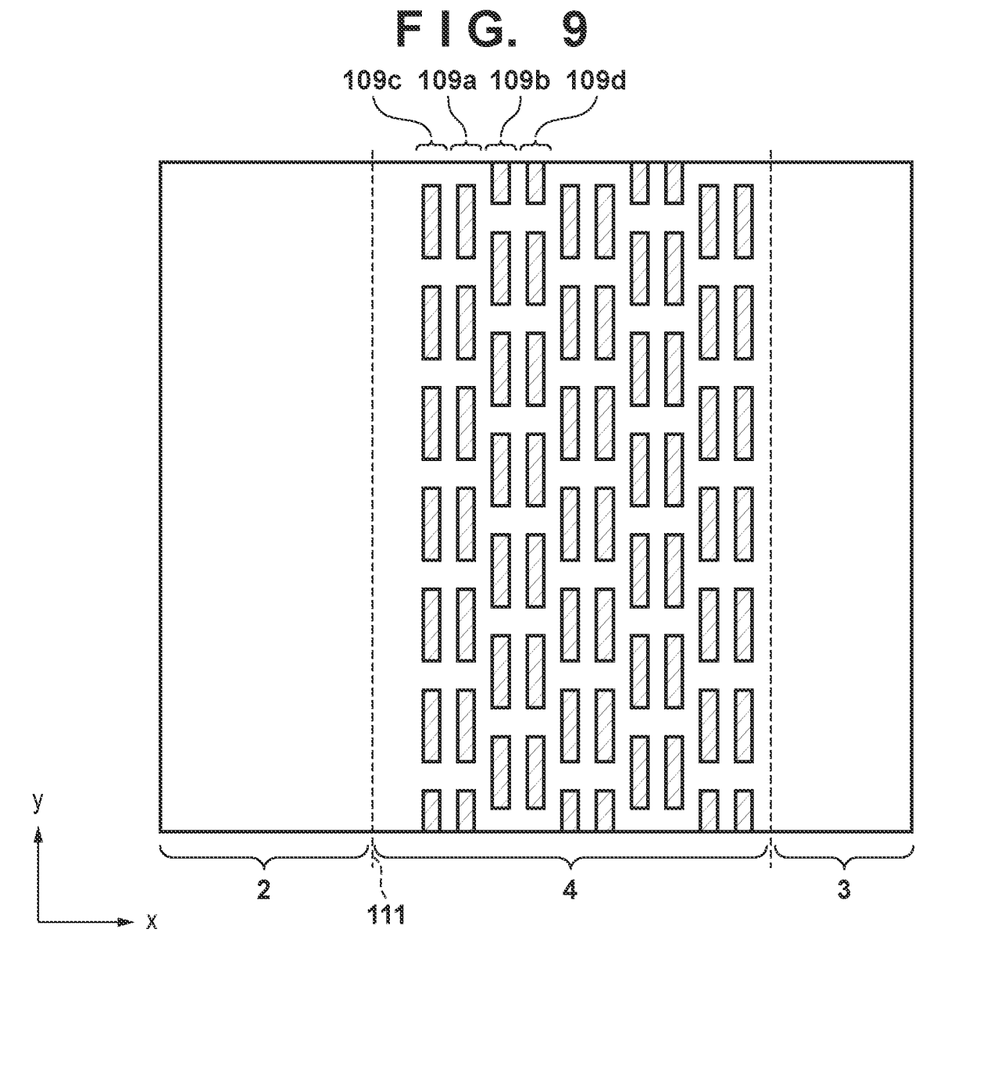
FIG. 9 is a plan view showing another modification of the trench region shown in FIG. 3.
Figure 10:
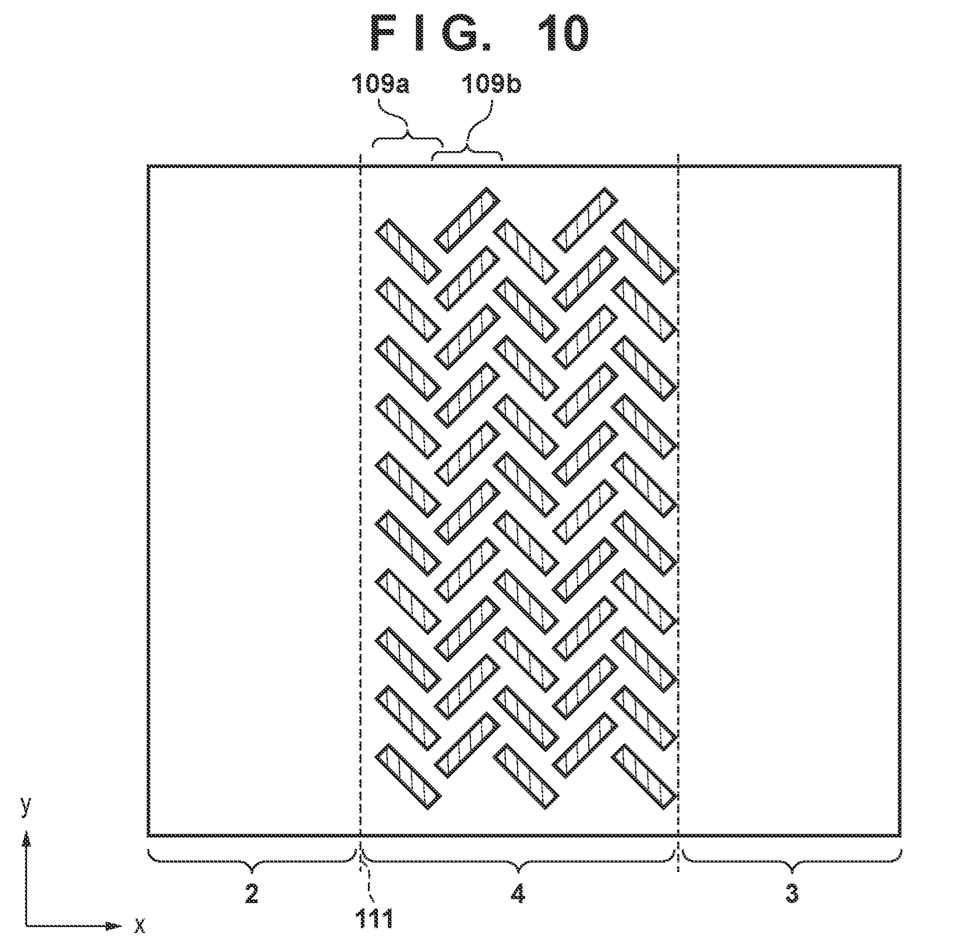
FIG. 10 is a plan view showing still another modification of the trench region shown in FIG. 3.

Alternatively, the plurality of trenches 109 may further include a plurality of trenches 109d (the fourth trenches) arranged to be spaced apart from each other in the y direction, as shown in FIG. 9. In the x direction, the plurality of trenches 109d are arranged to be spaced apart from the trenches 109b on the side opposite to the plurality of trenches 109a with respect to the plurality of trenches 109b. At this time, in the orthographic projection for the section along the y direction of the substrate 100, the plurality of trenches 109b are arranged to overlap the plurality of trenches 109d. As shown in FIG. 9, the trenches 109c, the trenches 109a, the trenches 109b, and the trenches 109d obtained by translating the trenches 109b in a direction opposite to the trenches 109a may be repeatedly arranged in order in the x direction.

In addition, the trenches 109 need not have a rectangular shape along the x and y directions. Each of the plurality of trenches 109a and the plurality of trenches 109b has, for example, a rectangular shape having a long side having a length of 1 µm and a short side having a length of 0.25 µm perpendicular to the long side. These trenches are arranged at the same pitch in the y direction. At this time, as shown in FIG. 10, the long side of each trench 109a has an inclination with respect to the y direction, and the long side of each trench 109b is arranged in a direction crossing the long side of the trench 109a. At this time, the interval between the long sides of the two adjacent trenches 109a or the long sides of the two adjacent trenches 109b is 0.3 µm. As shown in FIG. 10, the plurality of trenches 109a and the plurality of trenches 109b are shifted by a half pitch in the y direction. The long sides of the plurality of trenches 109a and the long sides of the plurality of trenches 109b may be arranged in directions perpendicular to each other. Alternatively, each of the long sides of the plurality of trenches 109a has an inclination of 45° with respect to the y direction. At this time, each of the long sides of the plurality of trenches 109b may have an inclination of −45° with respect to the y direction. Even in the arrangement shown in FIG. 10, there is no straight line path connecting a side 111 and the peripheral region 3 opposing the side 111 without overlapping any of the plurality of trenches 109a and the plurality of trenches 109b. That is, even in the arrangement shown in FIG. 10, the same effect as in the layouts of the trenches 109a and 109b shown in FIG. 3 can be obtained. In addition, even in the arrangement shown in FIG. 10, the pixel of the plurality of pixels which is arranged nearest to the trench region 4 and the trench of the plurality of trenches 109 which is arranged nearest to the pixel region 2 may be spaced apart from each other by a distance corresponding to the two pixels.

A modification of the layout of the trenches 109 of the trench region 4 in the orthographic projection for the section of the substrate 100 will be described with reference to FIGS. 11 and 12. The arrangement is the same as that of the image capturing device 1 except that trenches 122 different from the plurality of trenches 109 are arranged, differences will be mainly be described, and the description of a similar arrangement will be omitted.

Figure 11:
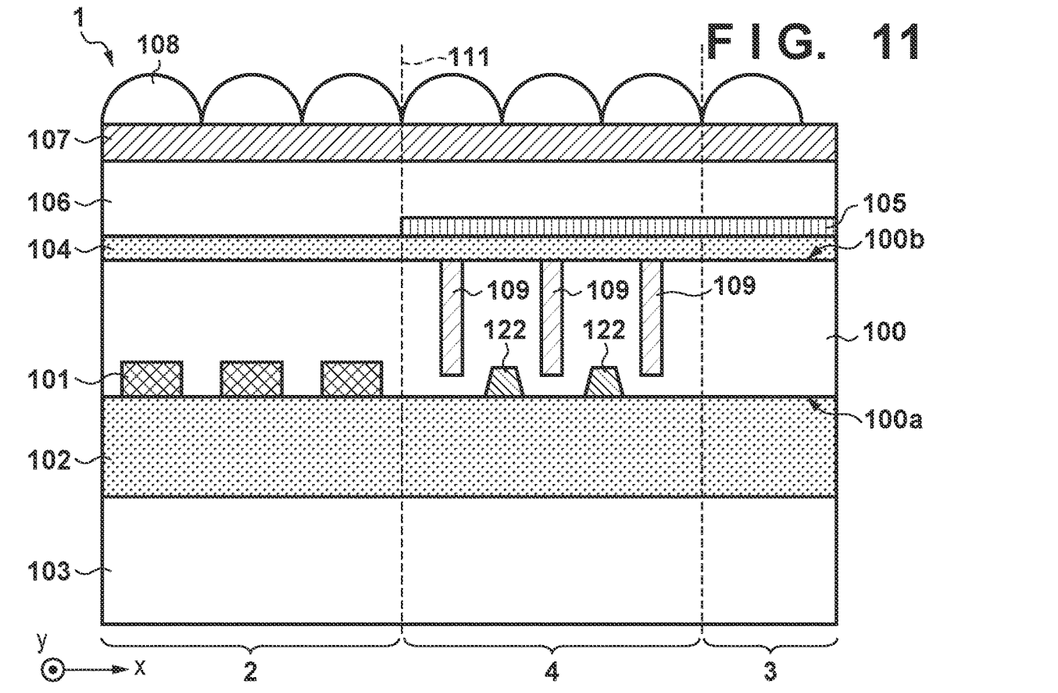
FIG. 11 is a sectional view showing a modification of the sectional view in FIG. 6.

As shown in FIG. 11, trenches 122 different from the trenches 109 arranged in the lower surface 100b of the substrate 100 may be formed on the upper surface 100a of the trench region 4 of the substrate 100. The trenches 122 may be formed, for example, simultaneously with formation of the element isolation structure of the STI structure in the pixel region 2 and the peripheral region 3 of the substrate 100. For this reason, the trenches 122 can be shallower than the trenches 109. As shown in FIG. 11, in the orthographic projection for the upper surface 100a of the substrate 100, the trenches 122 and the trenches 109 can be formed at different positions. Alternatively, as shown in FIG. 11, the depth of each trench 109 in the substrate 100 may overlap the depth of each trench 122 in the substrate 100. When the depths of the trenches 109 and 122 overlap each other, the impurity diffusion from the peripheral region 3 to the pixel region 2 can be more reliably suppressed.

Figure 12:
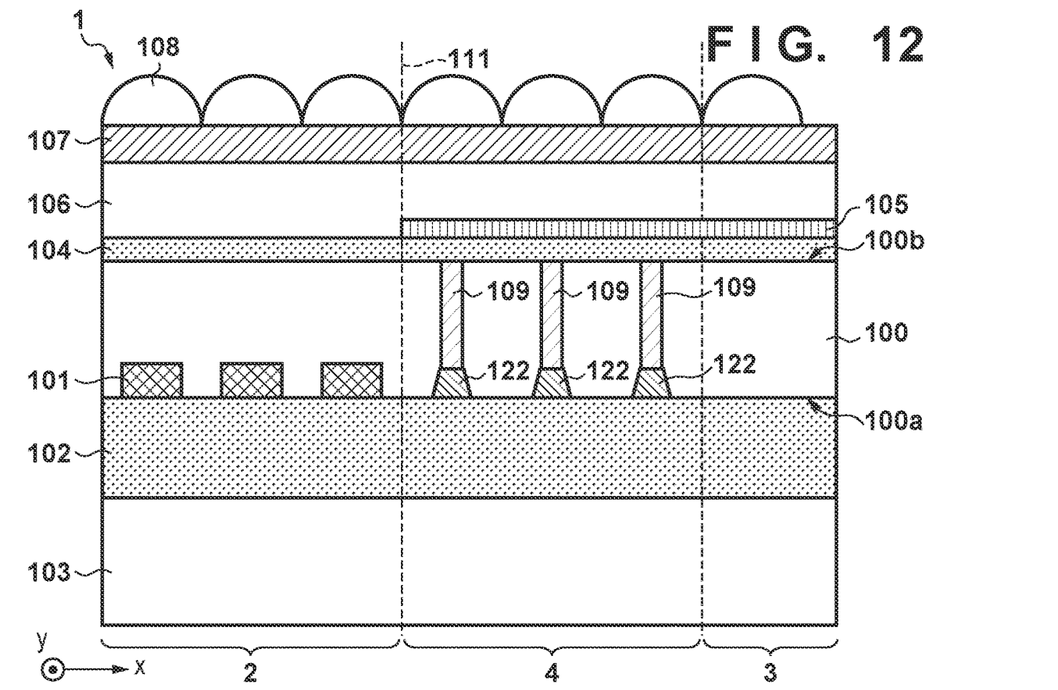
FIG. 12 is a sectional view showing a modification of the sectional view in FIG. 1.

As shown in FIG. 12, in the orthographic projection for the upper surface 100a of the substrate 100, the trenches 109 and the trenches 122 may be arranged at the same positions. In this case, as shown in FIG. 12, each trench 122 may be arranged to contact any one of the plurality of trenches 109. In addition, the trenches 122 may be arranged so as to correspond to the plurality of trenches 109, respectively. For example, the number of trenches 109 can be equal to that of the trenches 122. By bringing the trenches 109 into contact with the trenches 122, the impurity diffusion from the peripheral region 3 to the pixel region 2 can be further reliably suppressed.

As an application example of the image capturing device according to each of the above-described embodiments, a camera incorporating the image capturing device will exemplarily be described. The concept of the camera includes not only apparatuses mainly aiming at image capturing but also apparatuses (personal computer, portable terminal, and the like) having an auxiliary image capturing function. The camera includes the image capturing device according to the present invention exemplified as the above-described embodiments, and a signal processing unit configured to process information based on a signal output from the image capturing device. The signal processing unit can include a processor configured to process digital data that is image data. The processor can perform processing of calculating a defocus amount based on a signal from a pixel of the image capturing device, which has a focus detection function, and controlling focus adjustment of a photographing lens based on the defocus amount. An A/D converter that generates image data can be provided in the image capturing device or can be provided independently of the image capturing device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-155688, filed Aug. 22, 2018, which is hereby incorporated by reference herein in its entirety.

What is claimed is:

1. An image capturing device comprising:
a substrate having a first surface and a second surface, and comprising (1) a pixel region including a plurality of pixels each including a photo conversion element arranged between the first surface and the second surface, (2) a peripheral region arranged around the pixel region, and (3) a trench region, arranged between the pixel region and the peripheral region, and including a plurality of trenches extending from the first surface toward the second surface,
wherein the plurality of trenches include, between a first side of an outer edge of the pixel region and an inner-side edge of the peripheral region, (1) a plurality of first trenches arranged to be spaced apart from each other in a first direction parallel to the first side and (2) a plurality of second trenches arranged to be spaced apart from each other in the first direction,
wherein the plurality of first trenches and the plurality of second trenches are arranged to be spaced apart from each other in a second direction crossing the first direction, and
wherein the plurality of first trenches and the plurality of second trenches are arranged so that, in orthographic projection for the first surface of the substrate, any straight line path which connects, without passing through any one of the plurality of first trenches and the plurality of second trenches, the first side and the inner-side edge of the peripheral region, does not exist.

2. The device according to claim 1, wherein the plurality of first trenches include a rectangular (1-1)th trench and a rectangular (1-2)th trench adjacent to each other in the first direction,
    wherein the plurality of second trenches include a rectangular (2-1)th trench and a rectangular (2-2)th trench adjacent to each other in the first direction,
    wherein if a point which bisects, between the (1-1)th trench and the (1-2)th trench, a line passing through centers of a line connecting a point nearest to the first side in each of the (1-1)th trench and the (1-2)th trench and a line connecting a point farthest from the first side in each of the (1-1)th trench and the (1-2)th trench in the orthographic projection for the first surface is defined as a first point, then the (2-1)th trench is arranged at a position overlapping a line extending from the first point in the second direction, and
    wherein if a point which bisects, between the (2-1)th trench and the (2-2)th trench, a line passing through centers of a line connecting a point nearest to the first side in each of the (2-1)th trench and the (2-2)th trench and a line connecting a point farthest from the first side in each of the (2-1)th trench and the (2-2)th trench in the orthographic projection for the first surface is defined as a second point, then a straight line passing through the first point and the second point overlaps at least one of the (1-1)th trench, the (1-2)th trench, the (2-1)th trench, and the (2-2)th trench.

3. The device according to claim 1, wherein each of the plurality of first trenches and the plurality of second trenches in the orthographic projection for the first surface has a rectangular shape having a long side having a first length along the first direction and a short side having a second length along the second direction, and the plurality of first trenches and the plurality of second trenches are arranged at the same pitch in the first direction, and
    wherein the plurality of first trenches and the plurality of second trenches are shifted by a half pitch in the first direction.

4. The device according to claim 1, wherein each of the plurality of first trenches and the plurality of second trenches in the orthographic projection for the first surface has a rectangular shape having a long side having a first length and a short side having a second length and perpendicular to the long side, and the plurality of first trenches and the plurality of second trenches are arranged at the same pitch in the first direction,
    wherein the long side of each of the plurality of first trenches has an inclination with respect to the first direction,
    wherein the long side of each of the plurality of second trenches is arranged in a direction crossing the long side of each of the plurality of first trenches, and
    wherein the plurality of first trenches and the plurality of second trenches are shifted by a half pitch in the first direction.

5. The device according to claim 4, wherein the long side of each of the plurality of first trenches and the long side of each of the plurality of second trenches are arranged in directions perpendicular to each other.

6. The device according to claim 4, wherein in the orthographic projection for the first surface, the long side of each of the plurality of first trenches has an inclination of 45° with respect to the first direction.

7. The device according to claim 1, wherein the plurality of trenches further include a plurality of third trenches arranged to be spaced apart from each other in the first direction,
    wherein in the second direction, the plurality of third trenches are arranged to be spaced apart from the plurality of first trenches on a side opposite to the plurality of second trenches with respect to the plurality of first trenches, and
    wherein in orthographic projection for a section of the substrate along the first direction, the plurality of third trenches are arranged to overlap the plurality of first trenches.

8. The device according to claim 7, wherein the plurality of trenches further include a plurality of fourth trenches arranged to be spaced apart from each other in the first direction,
    wherein in the second direction, the plurality of fourth trenches are arranged to be spaced apart from the plurality of second trenches on a side opposite to the plurality of first trenches with respect to the plurality of second trenches, and
    wherein in orthographic projection for a section of the substrate along the first direction, the plurality of second trenches are arranged to overlap the plurality of fourth trenches.

9. The device according to claim 1, wherein each of the plurality of pixels further includes a transistor configured to transfer charges accumulated in the photoelectric conversion element,
    wherein the transistor is arranged on an upper surface of the substrate, and
    wherein the plurality of trenches are arranged on a lower surface of the substrate opposite to the upper surface.

10. The device according to claim 9, wherein in the orthographic projection for the first surface, (a) other trenches different from the plurality of trenches are arranged on the upper surface in the trench region, and (b) the other trenches and the plurality of trenches are arranged at different positions.

11. The device according to claim 10, wherein in orthographic projection for a section of the substrate, a depth at which the plurality of trenches are arranged overlaps a depth at which the other trenches are arranged.

12. The device according to claim 9, wherein in the orthographic projection for the first surface, (a) other trenches different from the plurality of trenches are arranged on the upper surface in the trench region, and (b) the other trenches are arranged to contact any one of the plurality of trenches.

13. The device according to claim 1, wherein a transistor including one of a cobalt silicide layer and a nickel silicide layer is arranged in the peripheral region.

14. The device according to claim 1, wherein a pixel of the plurality of pixels which is arranged nearest to the trench region and a trench of the plurality of trenches which is arranged nearest to the pixel region are spaced apart from each other by not less than a distance corresponding to two pixels in the second direction.

15. The device according to claim 1, wherein each of the plurality of trenches has a bottom in the substrate.

16. The device according to claim 1, wherein a depth of each of the plurality of trenches is not less than a half of a thickness of the substrate.

17. The device according to claim 1, wherein the plurality of trenches further include, between the inner-side edge of the peripheral region and a second side of the outer edge of the pixel region, which is opposite to the first side and parallel to the first direction, a plurality of fifth trenches arranged to be spaced apart from each other in the first direction and a plurality of sixth trenches arranged to be spaced apart from each other in the first direction, wherein the plurality of fifth trenches and the plurality of sixth trenches are arranged to be spaced apart from each other in the second direction, and wherein the plurality of fifth trenches and the plurality of sixth trenches are arranged so that, in the orthographic projection for the first surface, any straight line path which connects, without passing through any one of the plurality of fifth trenches and the plurality of sixth trenches, the second side and the inner-side edge of the peripheral region opposing the second side, does not exist.

18. The device according to claim 1, wherein the plurality of trenches further include, between the inner-side edge of the peripheral region and a third side of the outer edge of the pixel region, which is parallel to the second direction, a plurality of seventh trenches arranged to be spaced apart from each other in the second direction and a plurality of eighth trenches arranged to be spaced apart from each other in the second direction, wherein the plurality of seventh trenches and the plurality of eighth trenches are arranged to be spaced apart from each other in the first direction, and wherein the plurality of seventh trenches and the plurality of eighth trenches are arranged so that, in the orthographic projection for the first surface, any straight line path which connects, without passing through any one of the plurality of seventh trenches and the plurality of eighth trenches, the third side and the inner-side edge of the peripheral region opposing the third side, does not exist.

19. The device according to claim 18, wherein the plurality of trenches further include, between the inner-side edge of the peripheral region and a fourth side of the outer edge of the pixel region, which is opposite to the third side and parallel to the second direction, a plurality of ninth trenches arranged to be spaced apart from each other in the second direction and a plurality of 10th trenches arranged to be spaced apart from each other in the second direction, wherein the plurality of ninth trenches and the plurality of 10th trenches are arranged to be spaced apart from each other in the first direction, and wherein the plurality of ninth trenches and the plurality of 10th trenches are arranged so that, in the orthographic projection for the first surface, any straight line path which connects, without passing through any one of the plurality of ninth trenches and the plurality of 10th trenches, the fourth side and the inner-side edge of the peripheral region opposing the fourth side, does not exist.

20. A camera comprising:

an image capturing device comprising a substrate, the substrate having a first surface and a second surface, and comprising (1) a pixel region including a plurality of pixels each including a photo conversion element arranged between the first surface and the second surface, (2) a peripheral region arranged around the pixel region, and (3) a trench region arranged between the pixel region and the peripheral region, and including a plurality of trenches extending from the first surface toward the second surface, wherein the plurality of trenches include, between a first side of an outer edge of the pixel region and an inner-side edge of the peripheral region, (1) a plurality of first trenches arranged to be spaced apart from each other in a first direction parallel to the first side and (2) a plurality of second trenches arranged to be spaced apart from each other in the first direction, wherein the plurality of first trenches and the plurality of second trenches are arranged to be spaced apart from each other in a second direction crossing the first direction, and wherein the plurality of first trenches and the plurality of second trenches are arranged so that, in the orthographic projection for the first surface of the substrate, any straight line path which connects, without passing through any one of the plurality of first trenches and the plurality of second trenches, the first side and the inner-side edge of the peripheral region, does not exist; and a signal processor configured to process a signal obtained by the image capturing device.

21. The device according to claim 1, wherein the plurality of trenches are made of a solid material.

22. The device according to claim 21, wherein the plurality of trenches are made of at least one of an insulator, a metal, a metal oxide, or a metal nitride.

* * * * *